US012040414B2

(12) United States Patent
Bardfield (10) Patent No.: US 12,040,414 B2
(45) Date of Patent: Jul. 16, 2024

(54) FEED-THROUGH WIRING SOLUTION FOR SOLAR CELL MODULES (71) Applicant: The Boeing Company, Chicago, IL (US)

(72) Inventor: Rina S. Bardfield, Chicago, IL (US)

(73) Assignee: The Boeing Company, Arlington, VA (US)

( * ) Notice: Subject to any disclaimer, the term of this patent is extended or adjusted under 35 U.S.C. 154(b) by 0 days.

(21) Appl. No.: 17/348,192

(22) Filed: Jun. 15, 2021

(65) Prior Publication Data
US 2022/0052209 A1 Feb. 17, 2022

Related U.S. Application Data (60) Provisional application No. 63/064,088, filed on Aug. 11, 2020.

(51) Int. Cl.
H01L 31/02 (2006.01)
H01L 31/048 (2014.01)
H01L 31/049 (2014.01)
H01L 31/05 (2014.01)

(52) U.S. Cl.
CPC .... *H01L 31/02008* (2013.01); *H01L 31/0488* (2013.01); *H01L 31/049* (2014.12); *H01L 31/0504* (2013.01); *H01L 31/0508* (2013.01); *H01L 31/05* (2013.01)

(58) Field of Classification Search
CPC ............. H01L 31/0504; H01L 31/0508; H01L 31/049; H01L 31/05; H01L 31/0488; H01L 31/02008; H05K 2201/095
See application file for complete search history.

(56) References Cited

U.S. PATENT DOCUMENTS

| 4,773,945 A * | 9/1988 | Woolf ................... H01L 31/056 438/93 |
| 9,450,126 B1 | 9/2016 | Street et al. |
| 10,193,493 B2 | 1/2019 | Heppner et al. |
| 10,416,425 B2 | 9/2019 | Menard et al. |

(Continued)

FOREIGN PATENT DOCUMENTS

JP 2009139758 A * 6/2009

OTHER PUBLICATIONS

JP-2009139758-A, Machine Translation (Year: 2009).*
Extended European Search Report prepared by the European Patent Office in application No. EP 21 18 1717.6 dated Nov. 24, 2021.

*Primary Examiner* — Devina Pillay
(74) *Attorney, Agent, or Firm* — McDonnell Boehnen Hulbert & Berghoff LLP (57) ABSTRACT The present disclosure provides a solar cell module, comprising (a) a laminate substrate having a first surface and a second surface opposite the first surface, (b) a solar cell positioned on the first surface of the laminate substrate, (c) a first contact pad positioned on the first surface of the laminate substrate adjacent to the solar cell, (d) a second contact pad positioned on the second surface of the laminate substrate, (e) one or more vias positioned through the laminate substrate to electrically connect the first contact pad to the second contact pad, and (f) one or more interconnects extending from the solar cell and electrically coupling the solar cell to the first contact pad.

20 Claims, 6 Drawing Sheets (56) References Cited

U.S. PATENT DOCUMENTS

| | | | |
|---|---|---|---|
| 2002/0180015 A1* | 12/2002 | Yamaguchi | H05K 1/0271 |
| | | | 257/E23.008 |
| 2013/0323526 A1 | 12/2013 | Hasin et al. | |
| 2014/0034127 A1* | 2/2014 | Meitl | H01L 31/02008 |
| | | | 136/259 |
| 2015/0206997 A1* | 7/2015 | Fidaner | H01L 31/0725 |
| | | | 136/255 |
| 2018/0108794 A1* | 4/2018 | Aiken | H01L 31/0504 |
| 2019/0280136 A1* | 9/2019 | Kurizoe | H01L 31/02167 |
| 2019/0305723 A1 | 10/2019 | Rehder | |
| 2020/0350234 A1* | 11/2020 | Shan | H01L 23/5226 |

* cited by examiner

FEED-THROUGH WIRING SOLUTION FOR SOLAR CELL MODULES

CROSS REFERENCE TO RELATED APPLICATION

The present disclosure claims priority to U.S. application No. 63/064,088 filed on Aug. 11, 2020, the entire disclosure of which is herein incorporated by reference.

FIELD

The present disclosure is related generally to solar cell modules and more specifically to a feed-through wiring solution for a solar cell array comprising a plurality of solar cell modules.

BACKGROUND

A solar array generally is comprised of multiple solar cell modules connected together to produce electric power. Wiring must be completed across the solar cell modules to carry power to other devices. Current methods for extracting current from individual solar cell modules and routing them to the power bus for the solar cell array involves either flexible tabs that extend from the edge of each solar cell module or wires that are welded or soldered to the traces at the front side of each solar cell module. Getting the power from the front to the back side of the solar cell modules thus typically involves either allocating a sufficient gap between solar cell modules to enable wrapping of the wires or the flexible tabs around to the back of the assembly or including feed-through holes in the assembly to pass the wires from the front to the back of the solar cell modules.

Either of these options requires manual labor to execute the routing with a sufficient radius to avoid open joints due to thermal cycling stress. These wiring solutions also create a non-uniform front-side surface at the edges of the solar cell module, making it non-ideal for certain desired applications. Therefore, a solar module design that enables tighter packing of adjacent solar array modules and simplifies the array level assembly, while also providing a uniform front-side height profile may be desirable.

SUMMARY

In one aspect, the present disclosure provides a solar cell module. The solar cell module includes (a) a laminate substrate having a first surface and a second surface opposite the first surface, (b) a solar cell positioned on the first surface of the laminate substrate, (c) a first contact pad positioned on the first surface of the laminate substrate adjacent to the solar cell, (d) a second contact pad positioned on the second surface of the laminate substrate, (e) one or more vias positioned through the laminate substrate to electrically connect the first contact pad to the second contact pad, and (f) one or more interconnects extending from the solar cell and electrically coupling the solar cell to the first contact pad.

In another aspect, the present disclosure provides a solar cell array. The solar cell array comprises (a) a plurality of solar cell modules, wherein each of the plurality of solar cell modules includes (i) a laminate substrate having a first surface and a second surface opposite the first surface, (ii) a solar cell positioned on the first surface of the laminate substrate, (iii) a first contact pad positioned on the first surface of the laminate substrate adjacent to the solar cell, (iv) a second contact pad positioned on the second surface of the laminate substrate, (v) one or more vias positioned through the laminate substrate to electrically connect the first contact pad to the second contact pad, (vi) one or more interconnects extending from the solar cell and electrically coupling the solar cell to the first contact pad, and (b) a panel coupled to the laminate substrate of each of the plurality of solar cell modules, wherein adjacent solar cell modules of the plurality of solar cell modules abut one another such that there is not a gap therebetween.

In yet another aspect, a method for fabricating a solar cell module is described. The method includes (a) positioning a solar cell on a first surface of a laminate substrate, (b) positioning a first contact pad on the first surface of the laminate substrate adjacent to the solar cell, (c) positioning a second contact pad positioned on a second surface of the laminate substrate, (d) forming one or more vias through the laminate substrate to electrically connect the first contact pad to the second contact pad, and (e) electrically coupling one or more interconnects extending from the solar cell to the first contact pad.

The features, functions, and advantages that have been discussed can be achieved independently in various examples or may be combined in yet other examples further details of which can be seen with reference to the following description and figures.

BRIEF DESCRIPTION OF THE FIGURES

The novel features believed characteristic of the illustrative examples are set forth in the appended claims. The illustrative examples, however, as well as a preferred mode of use, further objectives and descriptions thereof, will best be understood by reference to the following detailed description of an illustrative examples of the present disclosure when read in conjunction with the accompanying figures.

DETAILED DESCRIPTION

Disclosed examples will now be described more fully hereinafter with reference to the accompanying figures, in which some, but not all of the disclosed examples are shown. Indeed, several different examples may be provided and should not be construed as limited to the examples set forth herein. Rather, these examples are provided so that this disclosure will be thorough and complete and will fully convey the scope of the disclosure to those skilled in the art.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Figure 4:
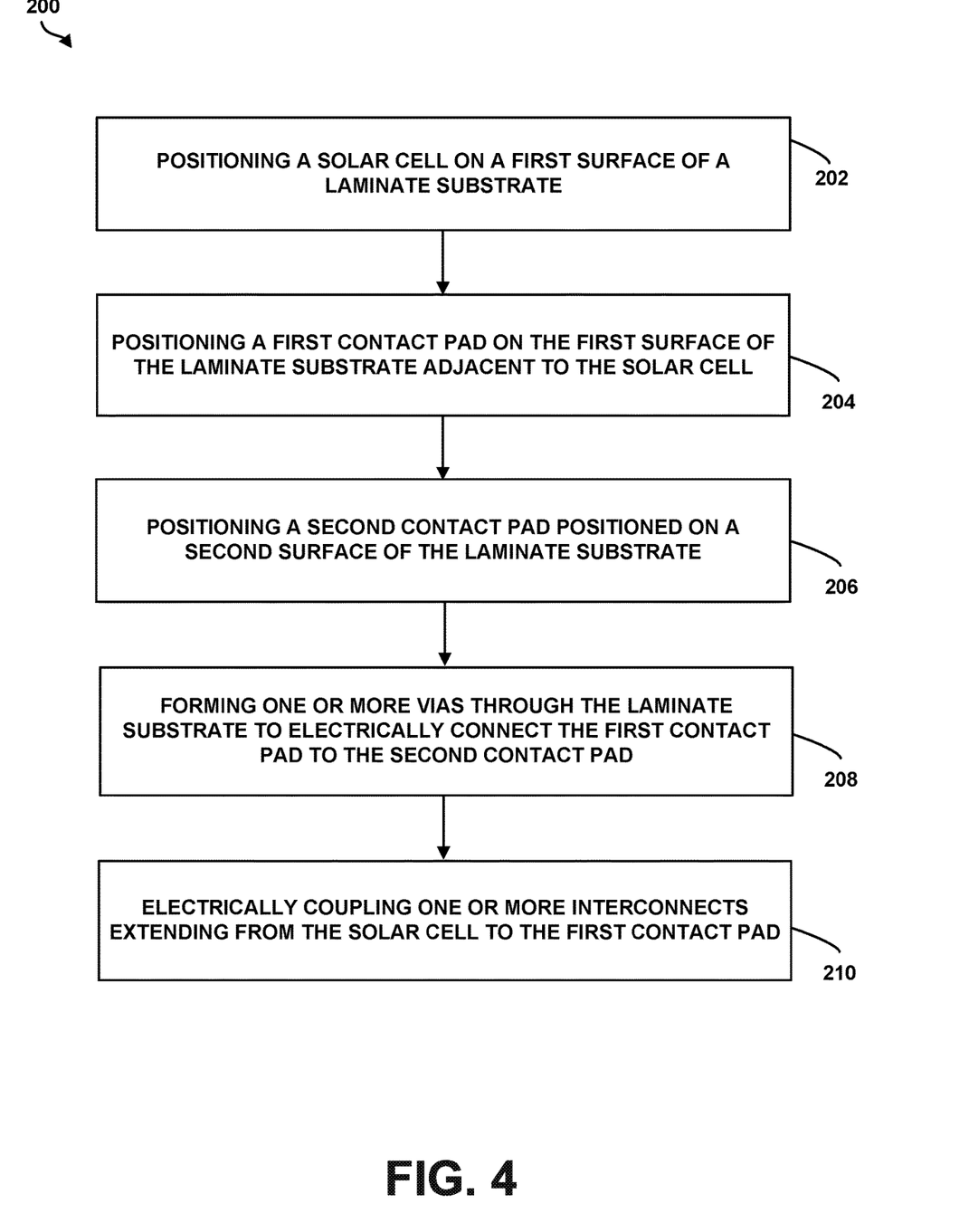
FIG. 4 is a flowchart of an example method, according to an example implementation.

In FIG. 4, the blocks represent operations and/or portions thereof and lines connecting the various blocks do not imply any particular order or dependency of the operations or portions thereof. It will be understood that not all dependencies among the various disclosed operations are necessarily represented. FIG. 4 and the accompanying disclosure describing the operations of the method(s) set forth herein should not be interpreted as necessarily determining a sequence in which the operations are to be performed. Rather, although one illustrative order is indicated, it is to be understood that the sequence of the operations may be modified when appropriate. Accordingly, certain operations may be performed in a different order or simultaneously. Additionally, those skilled in the art will appreciate that not all operations described need be performed.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

As used herein, a system, apparatus, device, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

As used herein, with respect to measurements, "substantially flat" means a surface without any features protruding therefrom.

Unless otherwise specifically noted, elements depicted in the drawings are not necessarily drawn to scale.

Illustrative, non-exhaustive examples, which may or may not be claimed, of the subject matter according the present disclosure are provided below.

The present disclosure provides a solar cell module, a solar cell array comprising a plurality of solar cell modules, and methods of manufacturing thereof. In particular, the present disclosure provides a low profile, high packing factor, reduced manufacturing cost solution for collecting power from a modular solar cell or flexible array assembly. Replacing the traditional Kapton® polyimide film substrate with a thin laminate including a two-sided cladding/patterning of front-side landing pads and back-side wiring routes with one or more vias in place of feed-through locations can result in the elimination of the need to allocate either gaps for wrapped wires or tabs or front-side height clearance for traditional feed-through wire routing. The solar cell module design described herein also can result in the elimination of manufacturing costs and a difficultly in redundancy with either of the heritage approaches. Further, the design described herein can enable tighter packing of the adjacent solar array modules and can simplify the array level assembly, while providing a uniform front-side height profile. The ability to maintain a flat front-side profile, while eliminating both the gaps and labor required for flexible tab or wire wrapping to the backside provides competitive advantages at the solar cell array level in terms of cost, packing factor, and reliability.

These and other improvements are described in more detail below. Implementations described below are for purposes of example. The implementations described below, as well as other implementations, may provide other improvements as well.

Figure 1A:
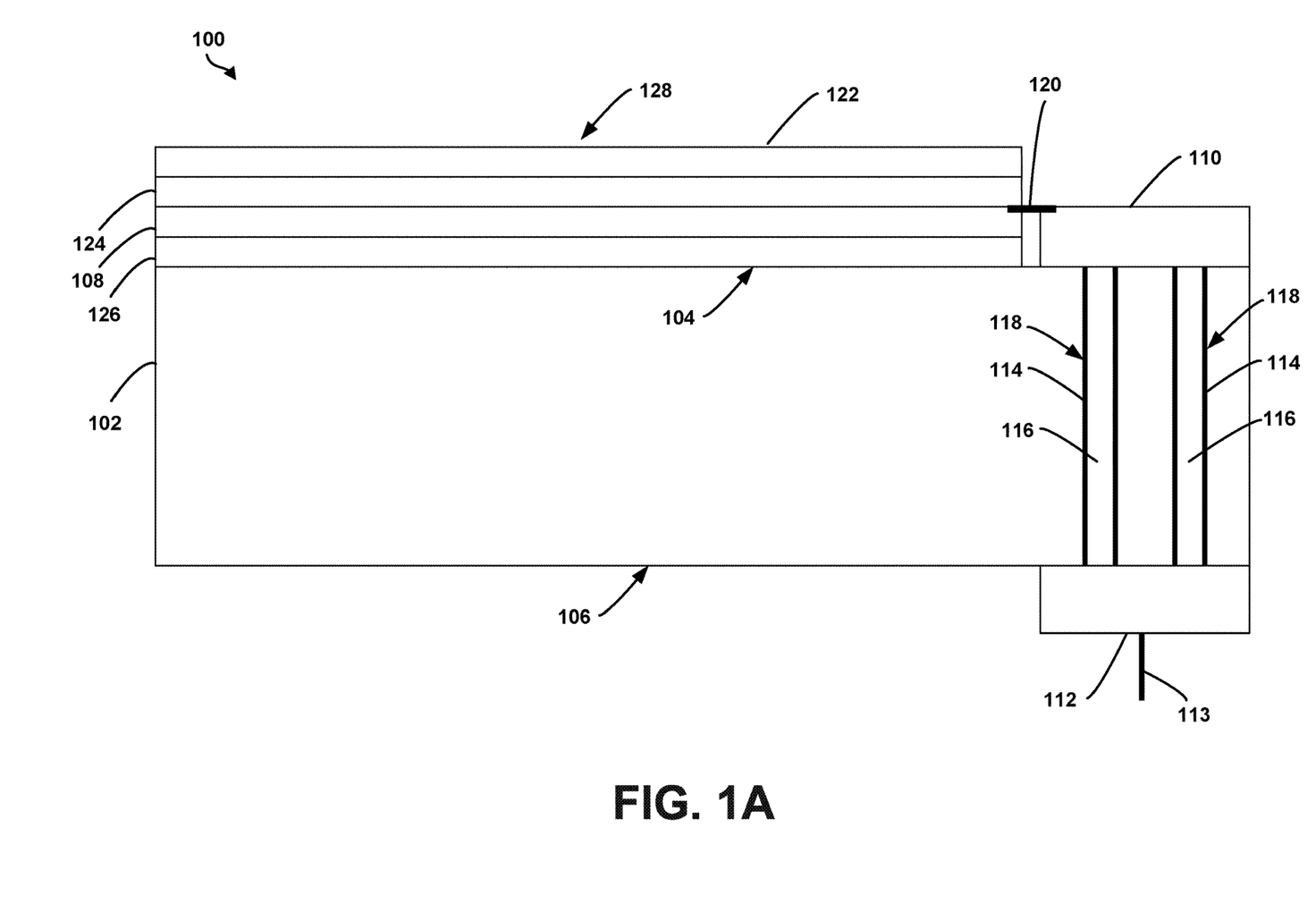
FIG. 1A is a side cross-sectional view of a solar cell module, according to an example implementation.

With reference to the Figures, FIG. 1A is a side cross-sectional view of a solar cell module 100 according to an example. As shown in FIG. 1A, the solar cell module 100 includes a laminate substrate 102 having a first surface 104 and a second surface 106 opposite the first surface 104. A thickness of the laminate substrate 102 ranges from about 3 mm to about 5 mm. In one example, the laminate substrate 102 comprises a fiberglass printed circuit board insulator material. The laminate substrate 102 comprises an insulating material capable of withstanding the rigors of space. In the proposed $3mm$ to $5mm$ thickness, the laminate substrate 102 is still reasonably flexible, making it compatible for integration into either a flexible modular array solution or as the top layer in a rigid modular array. In one example, the laminate substrate 102 is flexible. Such an arrangement is used when the solar cell module 100 described herein is utilized in a flexible modular array solution. In another example, the laminate substrate 102 is rigid. Such an arrangement is used when the solar cell module 100 described herein is utilized in a rigid modular array. As such, the solar cell module 100 described herein can be used in a variety of types of solar cell arrays.

The solar cell module 100 further includes a solar cell 108 positioned on the first surface 104 of the laminate substrate 102. The solar cell 108 can take on a variety sizes and forms, and comprises any structure for absorbing light from a light source to generate an electrical output in response thereto. In one example, the solar cell 108 comprises a single solar cell. In another example, the solar cell 108 comprises a plurality of solar cells connected in series on the first surface 104 of the laminate substrate 102, and the solar cell 108 is one of the plurality of solar cells.

The solar cell module 100 further includes a first contact pad 110 positioned on the first surface 104 of the laminate substrate 102 adjacent to the solar cell 108, and a second contact pad 112 positioned on the second surface 106 of the laminate substrate 102. In one example, the first contact pad 110 and the second contact pad 112 each comprise a conducting material. In one particular example, the first contact pad 110 and the second contact pad 112 each comprise a copper material. In such an example, the copper material comprises a cladding or a patterning on the first contact pad 110 and the second contact pad 112. In one example, the second contact pad 112 comprises a landing pad for connecting the solar cell module 100 to a backside harness or substrate insert. In another example, the second contact pad 112 comprises a trace pattern on the back of the laminate substrate 102 to replace wires for portions of harnessing. In yet another example, the second contact pad 112 is patterned with output wiring 113 to carry power captured by the solar cell 108 to other devices.

As further shown in FIG. 1A, the solar cell module 100 further includes one or more vias 114 positioned through the laminate substrate 102 to electrically connect the first contact pad 110 to the second contact pad 112. In one example, each of the one or more vias 114 comprise a through hole 116 including an interior surface 118 that is plated with a metallic material to thereby electrically connect the first contact pad 110 to the second contact pad 112. In one particular example, the metallic material comprises copper, although other conductive materials are possible as well.

The solar cell module 100 further includes one or more interconnects 120 extending from the solar cell 108 and electrically coupling the solar cell 108 to the first contact pad 110. The one or more interconnects 120 comprise a metal foil or other conductive material. In one example, the one or more interconnects 120 comprise an end tab that is welded, soldered, or conductively bonded to the first contact pad 110. In another example, the one or more interconnects 120 are welded, soldered, or conductively bonded directly to the first contact pad 110 without the presence of an end tab. In any event, the one or more interconnects 120 electrically connects the solar cell 108 to the first contact pad 110.

In one example, as shown in FIG. 1A, the solar cell module 100 further includes a coverglass 122 positioned on a top surface of the solar cell 108. In such an example, the solar cell module 100 further includes a glass bonding adhesive 124 positioned between the coverglass 122 and the solar cell 108. In another example, a circuit bonding adhesive 126 is positioned between the solar cell 108 and the laminate substrate 102. In one example, the circuit bonding adhesive 126 comprises a pressure sensitive adhesive tape. As shown in FIG. 1A, a top surface of the coverglass 122 and a top surface of the first contact pad 110 define a top surface 128 of the solar cell module 100. As shown in FIG. 1A, the top surface 128 of the solar cell module is substantially flat. As such, solar cell module 100 has no features that protrude from the top surface 128 of the solar cell module 100 higher than the surface of the solar cell 108 itself. In the example shown in FIG. 1A, the coverglass 122 covers the solar cell 108 but not the first contact pad 110.

Figure 1B:
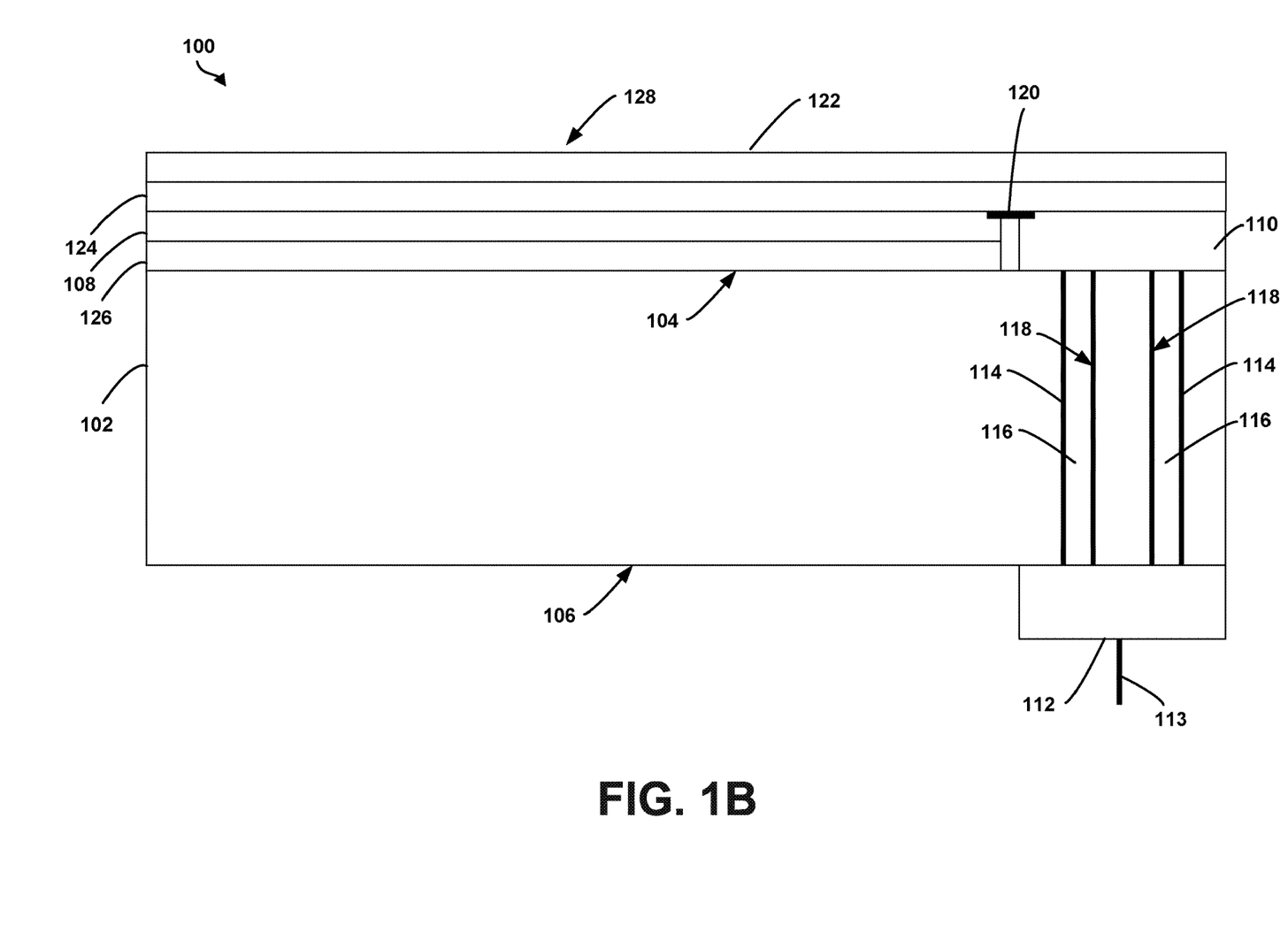
FIG. 1B is a side cross-sectional view of another solar cell module, according to an example implementation.

FIG. 1B is a side cross-sectional view of another arrangement of the solar cell module 100, according to an example implementation. An advantage of the arrangement of the solar cell module 100 shown in FIGS. 1A-1B is that there are no wires with diameters that would typically rise above the top surface of the solar cell 108. In traditional solar cell arrangements, this is not the case. Therefore, as shown in FIG. 1B, the solar cell module 100 provides a sufficiently flat front surface which lends itself to applications where it is desirable to bond a single large coverglass 122 over the entire solar cell module 100, thereby covering both the solar cell 108 and the first contact pad 110. Further, such an arrangement enables a single coverglass 122 to extend between adjacent solar cell modules 100 of a solar cell array, as discussed in additional detail below.

Figure 2A:
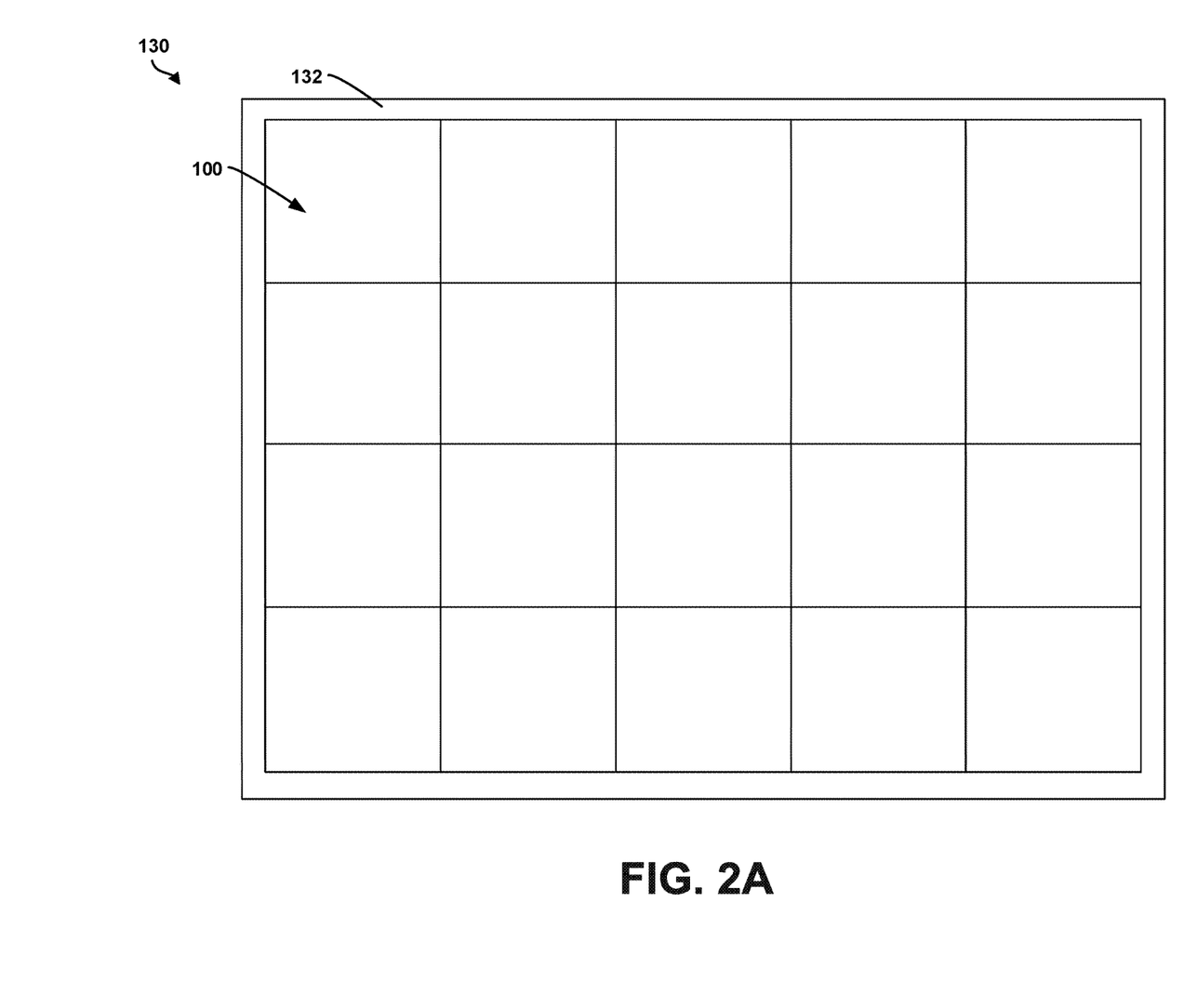
FIG. 2A is a top view of a solar cell array, according to an example implementation.

FIG. 2A illustrates a top view of a solar cell array 130, according to an example. As shown in FIG. 2A, the solar cell array 130 includes a plurality of solar cell modules 100, where each of the plurality of solar cell modules 100 includes the features of the solar cell module 100 described above in relation to FIGS. 1A-1B. The solar cell array 130 further includes a panel 132 coupled to the laminate substrate 102 of each of the plurality of solar cell modules 100. The panel 132 provides a surface on which to secure the plurality of solar cell modules 100, as well as a power bus to receive power from the second contact pad 112. Adjacent solar cell modules of the plurality of solar cell modules 100 abut one another such that there is not a gap therebetween. Such an arrangement provides a more densely packed modular solar cell array 130, which increases efficiency, improves power density, and improves the overall performance of the solar cell array 130.

Figure 2B:
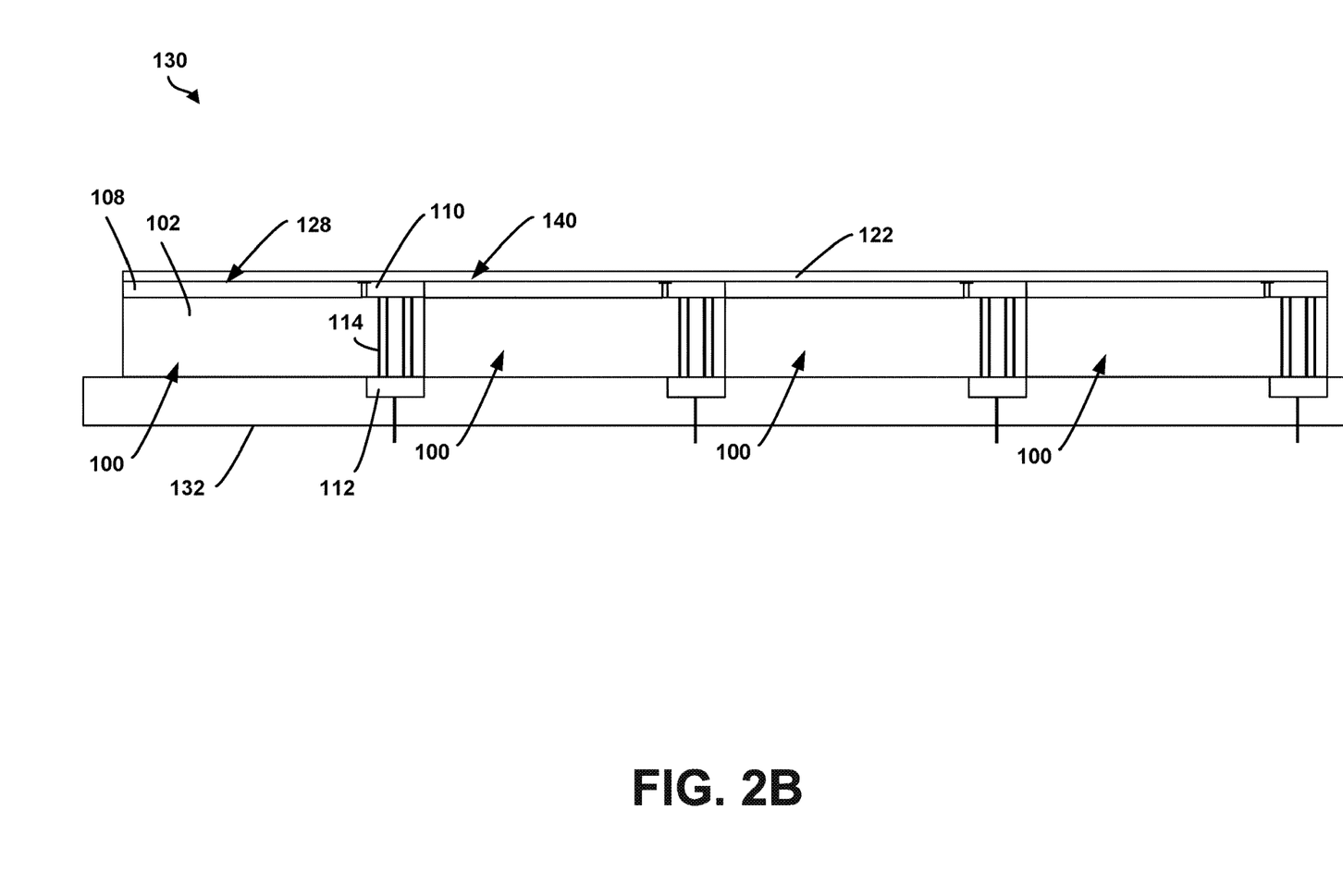
FIG. 2B is a side cross-sectional view of the solar cell array of FIG. 2A, according to an example implementation.

FIG. 2B illustrates a side cross-sectional view of the solar cell array 130 of FIG. 2A, according to an example. As shown in FIG. 2B, adjacent solar cell modules of the plurality of solar cell modules 100 abut one another such that there is not a gap therebetween. A top surface of the solar cell 108 and a top surface of the first contact pad 110 define a top surface 128 of each of the solar cell modules 100, and collectively a top surface 140 of the solar cell array 130. As shown in FIG. 2B, the top surface 140 of the solar cell array 130 is substantially flat. As such, the top surface 140 of the solar cell array 130 has no features that protrude from the top surface higher than the surface of the solar cell 108 itself. In one example, a single coverglass 122 is provided over the multiple solar cell modules 100 of the solar cell array 130, as shown in FIG. 2B. In another example, a separate coverglass 122 covers each individual solar cell module 100. In yet another example, the coverglass 122 covers two or more solar cell modules 100 of the solar cell array 130. Such arrangements are each possible due to the top surface 140 of the solar cell array 130 being substantially flat.

The arrangement described above with a substantially flat top surface of the solar cell modules 100 and a corresponding substantially flat top surface of the solar cell array 130 provides a variety of advantages over solar cell modules with protruding features. As an initial matter, flat solar cell module surfaces make such solar cell modules compatible with both folded and rolled array stowage, so they are able to fit into a smaller stowage volume inside a launch vehicle, without the need to allow for static or dynamic clearances for protruding components which typically complicate traditional flat panel array design. Further, protruding components of traditional arrangements limit the power per unit stowage volume (W/m$^3$) capability, so the flat surface of the solar cell modules 100 described herein provides a benefit of a more efficient solar cell system. Further still, the flat surface of the solar cell modules 100 described herein enables compatibility with applications where—for either manufacturability/cost savings or mission environment survivability reasons—it is desired to have a single coverglass 122 applied over the entire module as shown in FIG. 1B.

Figure 3:
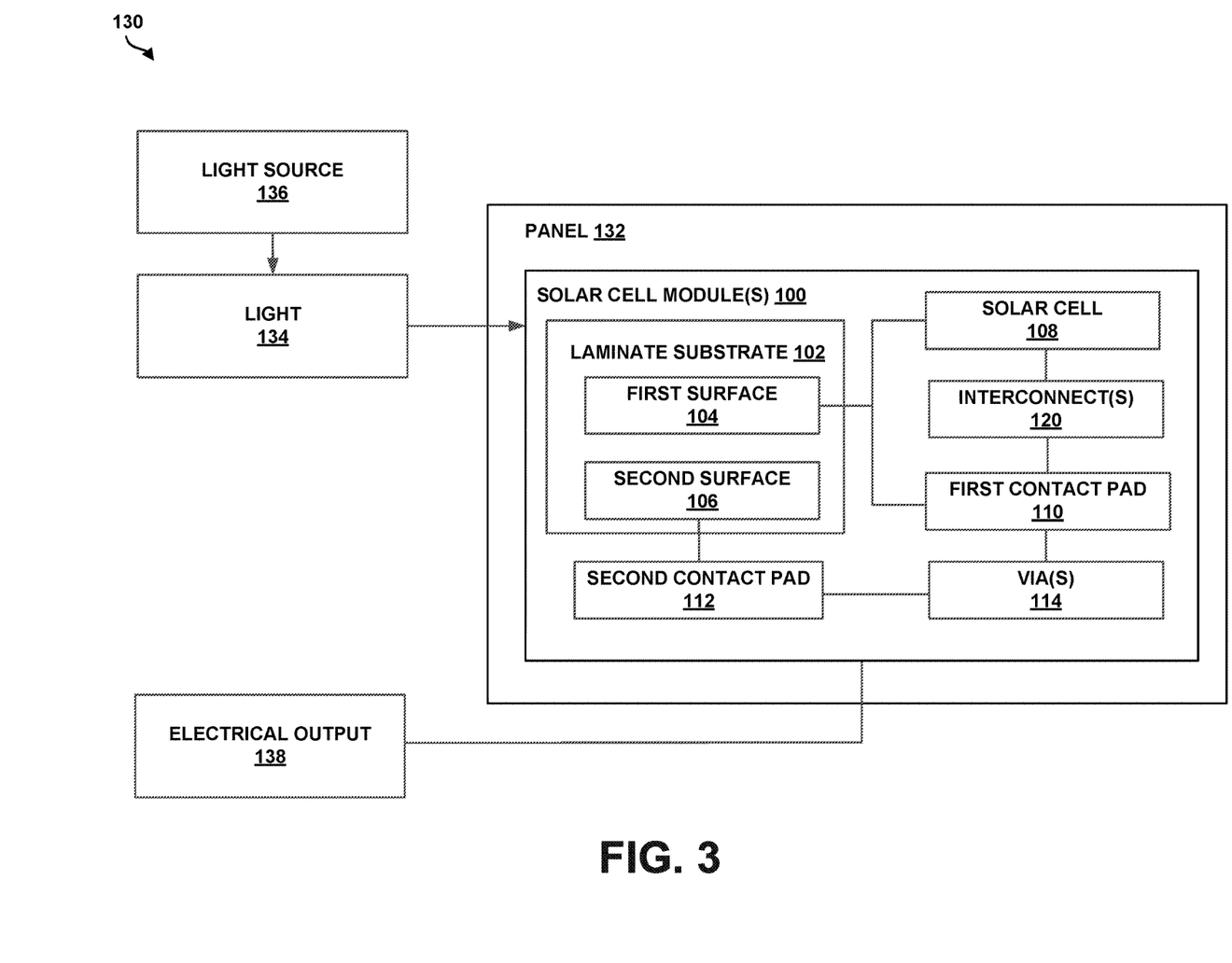
FIG. 3 is an illustration of a solar cell array in the form of a functional block diagram, according to an example implementation.

FIG. 3 is an illustration of a solar cell array 130 in the form of a functional block diagram. As shown in FIG. 3, the solar cell array 130 includes a panel 132 with one or more solar cell modules 100 positioned thereon. In one example, the panel 132 is rigid. In another example, the panel 132 is flexible, such as a mesh backing. The one or more solar cell modules 100 are series-connected in a line, e.g., from top to bottom in each column of solar cell modules 100. In one example, each column of solar cell modules 100 terminates in a metal strip at the top and/or bottom of the column, and multiple columns are connected together at the top and/or bottom of each column with a wire. Alternatively, the solar cell modules 100 is series-connected in a line, e.g., from left to right in each row of solar cell modules 100. In such an example, each row of solar cell modules 100 are terminated in a metal strip at the left and/or right of the row, and multiple rows are connected together at the left and/or right of each row with a wire. Each of the solar cell modules 100 absorbs light 134 from a light source 136 and generates an electrical output 138 in response thereto.

As discussed above, traditional methods for extracting current from individual solar cell modules involves either flexible tabs that extend from the edge of each solar cell module or wires that are welded or soldered to the traces at the front side of each solar cell module. Getting the power from the front to the back side of the solar cell modules thus typically involves either allocating a sufficient gap between solar cell modules to enable wrapping of the wires around the flexible tabs or including feed-through holes in the assembly to pass the wires from the front to the back of the solar cell modules.

Either of these options requires manual labor to execute the routing of the wires either around the flexible tabs or through the feed-through holes. This manual labor step is time consuming, and thus expensive. The solar cell module 100 and corresponding solar cell array 130 described herein eliminates the need for manual wrapping or feeding of the wires, and instead uses the combination of the interconnects 120, the first contact pad 110, the vias 114, and the second contact pad 112 to transfer power from the solar cell 108 on the front side of the solar cell module 100 to output wiring 113 on the back side of the solar cell module 100. Each of these components can be manufactured and assembled autonomously, thereby reducing cost and increasing precision of the solar cell module 100.

Further, in the case of the traditional flexible tab wiring solution, the existence of the flexible tabs creates a necessary gap (typically about 0.25 inches) between adjacent solar cell modules. As discussed above, the solar cell module 100 and corresponding solar cell array 130 described herein eliminate this gap between adjacent solar cell modules 100. Such an arrangement provides a more densely packed modular solar cell array 130, which increases efficiency, improves power density, and improves the overall performance of the solar cell array 130.

Further still, in the case of the traditional feed-though wiring solution, the front side of the solar cell module includes raised portions corresponding to the areas where the wiring will pass from the front side of the solar cell module to the back side of the solar cell module. Thus, the traditional feed-though wiring solution creates a non-uniform front-side surface at the edges of the solar cell module, which is not preferred for certain desired application as discussed above.

FIG. 4 is a block diagram of an example of a method 200 for fabricating a solar cell module 100. Method 200 shown in FIG. 4 presents an example of a method that could be used with any of the examples of the solar cell module 100 discussed above in relation to FIGS. 1A-3, as examples. Method 200 includes one or more operations, functions, or actions as illustrated by one or more of blocks 202-210. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

Initially, at block 202, the method 200 includes positioning a solar cell 108 on a first surface 104 of a laminate substrate 102. In one example, a circuit bonding adhesive 126 is positioned between the solar cell 108 and the laminate substrate 102 to thereby secure the solar cell 108 to the laminate substrate 102. In one example, the circuit bonding adhesive 126 comprises a pressure sensitive adhesive tape. At block 204, the method 200 includes positioning a first contact pad 110 on the first surface 104 of the laminate substrate 102 adjacent to the solar cell 108. At block 206, the method 200 includes positioning a second contact pad 112 positioned on a second surface 106 of the laminate substrate 102. The first contact pad 110 and the second contact pad 112 each comprise a conducting material. In one particular example, the first contact pad 110 and the second contact pad 112 each comprise a copper material. In such an example, the copper material comprises a cladding or a patterning on the first contact pad 110 and the second contact pad 112. In one example, such a cladding or a patterning is created autonomously without the need for manual intervention. In one example, the second contact pad 112 comprises a landing pad for connecting the solar cell module 100 to a backside harness or substrate insert. In another example, the second contact pad 112 comprises a trace pattern on the back of the laminate substrate 102 to replace wires for portions of harnessing. In yet another example, the second contact pad 112 is patterned with output wiring 113 to carry power captured by the solar cell 108 to other devices.

At block 208, the method 200 includes forming one or more vias 114 through the laminate substrate 102 to electrically connect the first contact pad 110 to the second contact pad 112. Each of the one or more vias 114 comprise a through hole 116 including an interior surface 118 that is plated with a metallic material to thereby electrically connect the first contact pad 110 to the second contact pad 112. In one particular example, the metallic material comprises copper, although other conductive materials are possible as well. At block 210, the method 200 includes electrically coupling one or more interconnects 120 extending from the solar cell 108 to the first contact pad 110. The one or more interconnects 120 comprise a metal foil or other conductive material. In one example, the one or more interconnects 120 comprise an end tab that is welded, soldered, or conductively bonded to the first contact pad 110. In another example, the one or more interconnects 120 are welded, soldered, or conductively bonded directly to the first contact pad 110 without the presence of an end tab.

In one example, the method 200 further includes positioning a coverglass 122 on a top surface of the solar cell 108. In such an example, the method 200 further includes positioning a glass bonding adhesive 124 between the coverglass 122 and the solar cell 108, to thereby secure the coverglass 122 to the solar cell 108. Further, in such an example, a top surface of the solar cell 108 and a top surface of the first contact pad 110 define a top surface 128 of the solar cell module 100, and the top surface 128 of the solar cell module 100 is substantially flat.

As discussed above, traditional wiring solutions require manual labor to execute the routing of the wires either around flexible tabs or through feed-through holes to thereby enable power to run from the front side to the back side of the solar cell module. This manual labor step is time consuming, and thus expensive. The solar cell module 100 and corresponding method of fabrication described herein eliminates the need for manual wrapping or feeding of the wires, and instead uses the combination of the interconnects 120, the first contact pad 110, the vias 114, and the second contact pad 112 to transfer power from the solar cell 108 on the front side of the solar cell module 100 to output wiring 113 on the back side of the solar cell module 100. Each of these components can be manufactured and assembled autonomously, thereby reducing cost and increasing precision of the solar cell module 100.

It should be understood that arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location, or other structural elements described as independent structures may be combined.

The description of the different advantageous arrangements has been presented for purposes of illustration and description, and is not intended to be exhaustive or limited to the examples in the form disclosed. Many modifications and variations will be apparent to those of ordinary skill in the art. Further, different advantageous examples may provide different advantages as compared to other advantageous examples. The example or examples selected are chosen and described in order to best explain the principles of the examples, the practical application, and to enable others of ordinary skill in the art to understand the disclosure for various examples with various modifications as are suited to the particular use contemplated.

What is claimed is:

1. A solar cell module, comprising:
    a laminate substrate having a first surface and a second surface opposite the first surface;
    a solar cell positioned on the first surface of the laminate substrate;
    a first contact pad positioned on the first surface of the laminate substrate adjacent to the solar cell;
    a second contact pad positioned on the second surface of the laminate substrate;
    one or more vias positioned through the laminate substrate to electrically connect the first contact pad to the second contact pad, wherein each of the one or more vias comprise a through hole including an interior surface that is plated with a metallic material to thereby electrically connect the first contact pad to the second contact pad such that the through hole remains through the laminate substrate, wherein the first contact pad and the second contact pad are positioned over the one or more vias; and
    one or more interconnects extending from the solar cell and electrically coupling the solar cell to the first contact pad.

2. The solar cell module of claim 1, wherein a top surface of the solar cell and a top surface of the first contact pad define a top surface of the solar cell module, and wherein the top surface of the solar cell module is substantially flat.

3. The solar cell module of claim 1, wherein a thickness of the laminate substrate ranges from about 3 mm to about 5 mm.

4. The solar cell module of claim 1, wherein the laminate substrate comprises a fiberglass printed circuit board insulator material.

5. The solar cell module of claim 1, further comprising a plurality of solar cells connected in series on the first surface of the laminate substrate, wherein the solar cell is one of the plurality of solar cells.

6. The solar cell module of claim 1, wherein the one or more interconnects are welded, soldered, or conductively bonded directly to the first contact pad.

7. The solar cell module of claim 1, wherein the one or more interconnects comprise an end tab that is welded, soldered, or conductively bonded to the first contact pad.

8. The solar cell module of claim 1, wherein the laminate substrate is flexible.

9. The solar cell module of claim 1, wherein the laminate substrate is rigid.

10. The solar cell module of claim 1, wherein the one or more vias comprise at least two vias, and further comprising output coupled to the second contact pad on a back side of the solar cell module.

11. The solar cell module of claim 1, further comprising:
    a coverglass positioned on a top surface of the solar cell.

12. The solar cell module of claim 11, further comprising:
    a glass bonding adhesive positioned between the coverglass and the solar cell; and
    a circuit bonding adhesive positioned between the solar cell and the laminate substrate.

13. The solar cell module of claim 1, wherein the first contact pad and the second contact pad comprise a copper material.

14. The solar cell module of claim 13, wherein the copper material comprises a cladding or a patterning on the first contact pad and the second contact pad.

15. A solar cell array, comprising:
    a plurality of solar cell modules, wherein each of the plurality of solar cell modules includes:
    a laminate substrate having a first surface and a second surface opposite the first surface;
    a solar cell positioned on the first surface of the laminate substrate;
    a first contact pad positioned on the first surface of the laminate substrate adjacent to the solar cell;
    a second contact pad positioned on the second surface of the laminate substrate;
    one or more vias positioned through the laminate substrate to electrically connect the first contact pad to the second contact pad, wherein each of the one or more vias comprise a through hole including an interior surface that is plated with a metallic material to thereby electrically connect the first contact pad to the second contact pad such that the through hole remains through the laminate substrate, wherein the first contact pad and the second contact pad are positioned over the one or more vias; and
    one or more interconnects extending from the solar cell and electrically coupling the solar cell to the first contact pad; and
    a panel coupled to the laminate substrate of each of the plurality of solar cell modules, wherein adjacent solar cell modules of the plurality of solar cell modules abut one another such that there is not a gap therebetween.

16. The solar cell array of claim 15, wherein each of the plurality of solar cell modules includes a coverglass positioned on a top surface of the solar cell.

17. The solar cell array of claim 15, wherein a top surface of the solar cell and a top surface of the first contact pad define a top surface of the solar cell array, and wherein the top surface of the solar cell array is substantially flat.

18. A method for fabricating a solar cell module, comprising:
    positioning a solar cell on a first surface of a laminate substrate;
    positioning a first contact pad on the first surface of the laminate substrate adjacent to the solar cell;
    positioning a second contact pad positioned on a second surface of the laminate substrate;

forming one or more vias through the laminate substrate to electrically connect the first contact pad to the second contact pad, wherein each of the one or more vias comprise a through hole including an interior surface that is plated with a metallic material to thereby electrically connect the first contact pad to the second contact pad such that the through hole remains through the laminate substrate, wherein the first contact pad and the second contact pad are positioned over the one or more vias; and electrically coupling one or more interconnects extending from the solar cell to the first contact pad.

19. The method of claim 18, further comprising:
positioning a coverglass on a top surface of the solar cell.

20. The method of claim 18, wherein a top surface of the solar cell and a top surface of the first contact pad define a top surface of the solar cell module, and wherein the top surface of the solar cell module is substantially flat.

\* \* \* \* \*